United States Patent [19]

Klopach et al.

[11] 4,278,933
[45] Jul. 14, 1981

[54] MEANS AND METHOD FOR DETERMINING SUSCEPTIBILITY TO RADIATED ENERGY

[75] Inventors: Robert T. Klopach, State College; Rickey E. Hartman, Lansdale, both of Pa.

[73] Assignee: American Electronic Laboratories, Inc., Colmar, Pa.

[21] Appl. No.: 49,395

[22] Filed: Jun. 18, 1979

[51] Int. Cl.³ .......................................... G01R 27/04
[52] U.S. Cl. ............................ 324/58 R; 324/58.5 R
[58] Field of Search .................. 324/95, 58 R, 58 A, 324/58 B, 72, 58.5 R

[56] References Cited

U.S. PATENT DOCUMENTS 2,606,974   8/1952   Wheeler .......................... 324/58 R

OTHER PUBLICATIONS

Crawford, M. L.; "Techniques For Measurement...";
EMCMON, 1975, pp. 38–44.

"Measurement of Military Standard . . . "; MIL-STD-462, Methods RSO1, RSO2, RSO3; Jul. 31, 1967.

*Primary Examiner*—Ernest F. Karlsen
*Attorney, Agent, or Firm*—Jacob Trachtman

[57] ABSTRACT

A testing means for determining susceptibility to radiated energy and leakage of energy from a device having a conductive surface comprising a stripline unit for transmitting radiant energy in the principal transverse electromagnetic mode including a first conductive ground plane element, a second conductive ground plane element spaced from and parallel to the first ground plane element, and a plane center conductor element positioned intermediate and parallel to the first and second ground plane elements. The stripline unit has first and second end sections providing energy coupling means, and an intermediate section between the end sections for transmitting energy therealong. A portion of the first ground plane element of the intermediate section of the stripline unit has an opening for being closed by a conductive surface of a device which is to be tested and which effectively provides a portion of ground plane of the stripline unit.

23 Claims, 5 Drawing Figures

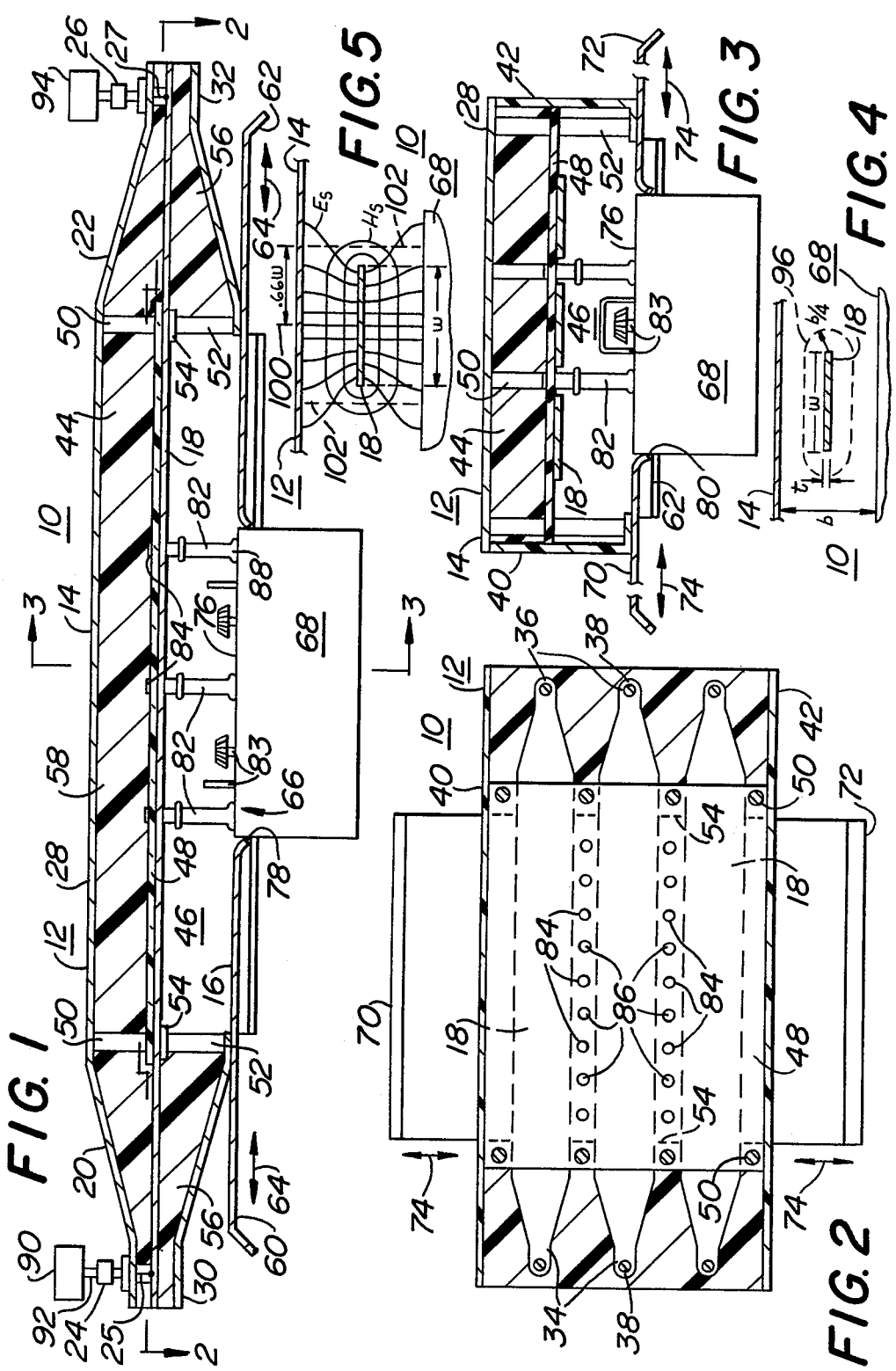

MEANS AND METHOD FOR DETERMINING SUSCEPTIBILITY TO RADIATED ENERGY

The U.S. Government has a paid-up license in this invention and the right in limited circumstances to require the patent owner to license others on reasonable terms as provided for by the terms of contract No. DAAB07-76-0332 awarded by the Department of the Army.

BACKGROUND OF THE INVENTION

The invention relates to a means and method for determining susceptibility of a device to radiated energy, and more particularly to a means and method utilizing a stripline unit for applying radiated energy to a device or measuring the leakage of energy from the device under test.

Since many devices, such as electronic equipment and electromechanical apparatus are susceptible to electromagnetic radiation and may also emit radiation, testing means for determining such susceptibility to radiation and emission of radiation have been utilized. In order to determine the susceptibility of a device to radiation, it must be subjected to field strengths which are representative of the environment in which it will be operated. For testing purposes, the test fields to which such devices are subjected should be determinable to a high degree of certainty. It is therefore desirable that such fields be uniform and well behaved so that the level of radiation to which the equipment is subject can be accurately determined.

In order to achieve such conditions, devices have been subjected to radiation inside of shielded or screened enclosures where good electrical isolation is obtained from external radiation. Even with such shielded enclosures, serious measurement problems and errors can result due to the high conductivity and reflectivity of the enclosure walls which set up standing waves which may interfere with the signals being measured. Such conditions have been considered in the article by Myron L. Crawford entitled Techniques For Measurement Of Electromagnetic Radiation And Susceptibility Of Electronic Equipment in EMCMON 1975, pages 38-44.

In order to avoid such reflecting surfaces underground rooms or tunnels have been used as test chambers for measurements at frequencies of about a few megahertz since the non-metallic, lossy, and irregular walls of low reflectivity, reduce reflections and antenuate the transmitted or received energy. Another technique utilizes a transverse electromagnetic transmission (TEM) cell at frequencies below a few hundred megahertz in which the device under test is placed wholly within the cell. The cell acts as a shielded enclosure providing the desired electrical isolation and provides a known uniform transverse electromagnetic field within it for susceptibility testing of the equipment. However, since the equipment must be placed entirely within the cell, the size of the equipment under test must be limited and the upper frequency limit for the transmitted wave is considerably reduced as a function of the cell size.

The test methods presently being used are also exemplified by the specifications in Measurement of Military Standard Electromagnetic Interference Characteristics, July 31, 1967, MIL-STD-462, Methods RS01, RS02, RS03 (Radiated Susceptibility). Such specified tests require high powered generators to provide the representative field strengths, and the fields generated are perturbed by reflections from the shielded enclosures. The parallel stripline described in MIL-STD-462, also severely limits the size of the equipment which can be tested.

SUMMARY OF INVENTION

Therefore, it is an object of the invention to provide a new and improved means and method for determining susceptibility to radiated energy and leakage of energy from a device.

Another object of the invention is to provide a new and improved means and method for determining susceptibility to radiated energy and leakage of energy from a device over a wide band of frequencies including very low frequencies.

Another object of the invention is to provide a new and improved means and method for determining susceptibility to radiated energy and leakage of energy from a device which efficiently applies radiated energy over a wide band of frequencies having a high cut-off frequency which is not limited by the size of the device being tested.

Another object of the invention is to provide a new and improved means and method for determining susceptibility to radiated energy and leakage of energy from a device which provides controlled conditions with substantially uniform and well defined radiation fields which are known with a high degree of certainty.

Another object of the invention is to provide a new and improved means and method for determining susceptibility to radiated energy and leakage of energy from a device which does not require that the device to be tested be received entirely into the testing means.

Another object of the invention is to provide a new and improved means and method for determining susceptibility to radiated energy and leakage of energy from a device in which high field strengths can be generated with use of a transmitter of low power.

Another object of the invention is to provide a new and improved means and method for determining susceptibility to radiated energy and leakage of energy from a device utilizing a relatively small testing means and providing a very high high frequency cut-off for radiated energy.

Another object of the invention is to provide a new and improved means and method for determining susceptibility to radiated energy and leakage of energy from a device which is of reduced size and portable while still providing high utility.

Another object of the invention is to provide a new and improved means and method for determining susceptibility to radiated energy and leakage of energy from a device which is relatively inexpensive to construct and use, and is highly efficient in operation.

These objects are achieved by a testing means and method utilizing a stripline unit for transmitting radiant energy in the principal transverse electromagnetic mode (TEM). The stripline unit includes a first conductive ground plane element, a second conductive ground plane element spaced from and parallel to the first ground plane element, and at least one plane center conductor element positioned intermediate and parallel to the first and second ground plane elements. The stipline unit has first and second end sections providing energy coupling means, and an intermediate section between the end sections for transmitting energies therealong. A portion of a ground plane element of the intermediate section of the stripline unit provides an opening for being closed by a conductive surface of a device which is to be tested. The opening in the ground plane element is provided by first and second pairs of oppositely positioned portions which are slideably supported in respective sets of tracks and each movable to adjust the size of the opening in the ground plane element. The first pair of slideable portions move to adjust the longitudinal size of the opening, while the second pair of slideable portions move in a direction transverse to that of the first pair of slideable portions to adjust the transverse size of the opening. The slideable portions have edges for good electrical engagement with the device to be tested for reducing leakage of energy transmitted by the stripline unit.

The intermediate portion of the stripline unit includes a thin plane member of insulating material positioned between and parallel to the first and second ground plane elements and proximate to the plane of the center conductor element. The plane member has a plurality of spaced openings for respectively receiving and detachably securing therewith the insertable ends of respective insulator rods. The insulator rods are so positioned with the plane member that their other ends contact the conductive surface of the device which is to be tested and space it with respect to the center conductor element.

A source of electrical energy is coupled with an end section of stripline unit for transmission of energy in the principal transverse electromagnetic mode to the second end section for subjecting the device being tested to the transmitted energy. The other end of the stripline unit is connected to terminating means having an impedance which is the characteristic impedance of the stripline unit. Energy may be provided to the stripline unit over a wide frequency band for application to the device under test for determining its susceptibility to a wide spectrum of radiated energy.

For determining leakage of energy from the device under test, energy measuring means which detects energy over a wide band of frequencies is connected with the coupling mean of the first end section of the stripline unit while the coupling means of the second end section of the stripline unit is connected to the terminating means providing the characteristic impedance of the stripline unit. The energy transmitted to the first end section of the stripline unit is detected and measured by the measuring means to provide the desired information. When desired measuring means may also be connected with coupling means of both end sections.

The method of the invention for testing the susceptibility of a device having a conductive surface to radiated energy and for measuring leakage of energy therefrom comprises the steps of providing a stripline unit for transmitting radiant energy in the principal transverse electromagnetic mode. The stripline unit used has first and second conductive ground plane elements and center conductor elements intermediate the ground plane elements and an opening in the ground plane element. The device which is to be tested is positioned with respect to the stripline unit so that a conductive surface of the device closes the opening of the ground plane of the stripline unit and effectively provides a portion of the ground plane of the stripline unit. Electrical energy is applied for transmission by the stripline unit.

The method includes a step of adjusting the opening of the ground plane element for accommodating the conductive surface of the device which is to be tested and the step of electrically connecting and joining the conductive surface of the device to be tested with the ground plane element which provides the opening, for reducing leakage of energy transmitted by the stripline unit. Prior to positioning the device the method includes the step of securing detachable insulating means to the stripline unit at selected locations for engaging the device and spacing its conductive surface with respect to the center conductor element of the stripline unit.

For determining the susceptibility of the device being tested to radiant energy, energy is applied from an external source to the stripline unit. The energy is transmitted by the stripline unit and the device being tested is subjected to the transmitted energy. For determining leakage energy from a device being tested, the method includes the step of detecting and measuring the energy transmitted by the stripline unit which leaks from the device being tested.

When the device under test is subjected to radiation transmitted by the stripline unit, the surface of the device has applied to it the transmitted wave, and energy is radiated into the equipment at any openings or locations where the shielding effect of the conductive surface is not adequate. During such tests the equipment under test is energized for operation in usual manner and the device is monitored for determining any variations in its usual operating characteristics for determining adverse effects. The device, at its surface being tested, may be subjected to field strengths of different intensities by properly adjusting the power of the transmitted signal, and also to signals of various frequencies over a wide band as previously described. In the case where the device is being tested for determining the shielding of its surface against leakage of radiation, it is also operated in the manner required for radiation susceptibility test purposes, while the energy leaked to the stripline unit is detected by appropriate apparatus, such as measuring means coupled with its end sections. Data on the frequency and intensity of signal leakage from the device may, thus, be determined and recorded.

For a full understanding of the nature and objects of the invention, reference should be had to the following detailed description taken in connection with the accompanying drawing.

BRIEF DESCRIPTION OF THE DRAWING

FIG. 1, is an elevational sectional view of the testing means embodying the invention illustrating its use in connection with a device under test, FIG. 2 is a sectional view taken on the line 2—2 of FIG. 1, FIG. 3 is a sectional view taken on the line 3—3 of FIG. 1, FIG. 4 is a diagrammatic sectional view of a portion of the testing means of FIG. 1 illustrating and defining the mean circumference of the stripline unit, and FIG. 5 is a diagrammatic sectional view similar to that of FIG. 4 illustrating the electromagnetic fields generated by the transmitted energy in the principal transverse electromagnetic mode.

DETAILED DESCRIPTION

The FIGS. 1 to 3 disclose a testing means 10 for applying transmitted radiated energy to a device to be tested or measuring the leakage of energy from the device under test, embodying the invention.

The testing means 10 comprises a stripline unit 12 having top and bottom ground plane elements 14 and 16 formed of a metal sheet material, such as brass. At least one conductive center conductor element 18 is positioned intermediate to the top and bottom ground plane elements 14 and 16 and may also be made of brass or other suitable conductive material. The testing means 10 has first and second end sections 20 and 22 providing energy coupling means which may include coaxial couplers 24 and 26, and an intermediate section 28.

The end sections 20 and 22 of the stripline unit 12 are tapered from the height of the intermediate section 28 to the reduced height provided at their ends 30 and 32. This configuration is provided by the top and bottom ground plane elements 14 and 16 which are positioned opposite and parallel to each other at the intermediate section 28, while at the end sections 20 and 22, their spacing is gradually reduced to that provided at the ends 30 and 32. The illustrated embodiment of the testing means 10 utilizes a plurality of three flat center conductor elements 18 of narrow width, each positioned in the same plane and equally spaced between the top and bottom ground plane elements 14 and 16. Each of its elements 18 has a constant width along its length extending through the intermediate section 28, while at the opposite end portions 34 and 36, it tapers to a reduced width in the direction of their ends 38.

A respective coaxial connector 24 is provided at the end section 20 for each of the center conductor elements 18. The outer conductor of each of the coaxial connectors 24 is connected to the ground plane element 14, while its center conductor 25 is connected with the end 38 of an end portion 34 of a respective one of the center conductor elements 18. Similarly a coaxial connector 26 is provided at the end section 22 for each of the center conductor elements 18, with its outer conductor connected to the ground plane element 14 and its center conductor 27 joined with an end 38 of an end portion 36 of a respective one of the ground plane elements 18. The end sections 20 and 22, thus, provide means for being electrically coupled with the ends 38 of each of the center conductor elements 18.

A pair of parallel nonconductive wall members 40 and 42 completely enclose the space between the top and bottom ground plane elements 14 and 16. The enclosed space within the intermediate section 28 of the stripline unit 14, is divided into upper and lower cavities 44 and 46, by a thin support member 48 which is made up of an insulating material. The support member 48 is positioned above the center conductor elements 18 and extends between the side wall members 40 and 42 intermediate and parallel to the top and bottom ground plane elements 14 and 16. The support member 48 is retained and positioned by a plurality of upper and lower posts 50 and 52 extending respectively between it and the top and bottom ground plane elements 14 and 16. The posts are also made of an insulating material and are located at opposite ends of the intermediate section 28 of the stripline unit 12. The center conductor elements 18 may be supported at the underside of the support element 48 by a suitable adhesive, and are also secured between the support member 48 and transverse strips 54 at opposite ends of the intermediate section 28. The strips 54 are secured with the top ends of the lower support posts 52 and extend between the side wall members 40 and 42 at the ends of the intermediate section 28. An insulating material 56 of low dielectric constant of approximately 1, such as provided by polyethylene foam, is inserted into the cavities of the end sections 20 and 22 for supporting and positioning the end portions 34 and 36 of the center conductor elements 18 and adding rigidity to the end sections 20 and 22. Insulating foam material 58 may also be received in the upper cavity 44 of the intermediate section 28 for providing support and rigidity to the stripline unit 12.

The bottom ground plane element 16 is provided with a pair of panels 60, 62, made of conductive sheet material, which are slideably supported by tracks for movement in the longitudinal direction toward and away from each other. As indicated by the arrows 64 in FIG. 1, movement of the panels 60 and 64 adjusts the size of an opening 66 therebetween for accommodating the length of a device 68 which is to be tested for susceptibility to radiation or for determining leakage therefrom of radiation. A second pair of conductive panels 70 and 72 are positioned under the first pair of panels 60, 62, by tracks for slideable movement towards and away from each other in the transverse direction of the stripline unit 12. The movement of the panels 70 and 72 adjusts the width of the openings 66 in the bottom ground plane element 16 of the intermediate section 28 to accommodate the depth of the device 68 which is to be tested. The movements of the longitudinal and transversely adjustable panels 60, 62 and 70, 72 allows the ground plane unit 16 by their respective inner edges 78 and 80 to provide an opening therein with a desired rectangular configuration for accommodating the rectangular dimensions of a device 68 which is to be tested. Of course, if the device to be tested 68 has another configuration, the inner edges 78 and 80 of the panels may be made to conform therewith, and the panels may be removable and replaced by panels having the desired edge configurations for providing an opening 66 for receiving a surface 76 of the body 68 and electrical contacting and joining the body 68 at the lower border of the cavity 46.

Devices 68 which are to be tested for susceptibility to radiated energy or for determining leakage of radiation therefrom, are generally shielded by being provided with a metal outer casing and the invention relates to the testing of such devices 68 which have such a conductive outer casing or may be provided with same. The upper conductive surface 76, for purpose of testing device 68 is positioned within the opening 66 so as to conform with the panels 60, 62, 70 and 72 of the bottom ground plane element 16 and provide an effective ground plane for the intermediate section 28 of the stripline unit 12. In order to minimize leakage of energy from the cavity 46 of the stripline unit 12, the inner edges 78 of the longitudinal panels 60 and 62, and the inner edges 80 of the transverse panels 70, 72 may be provided with curved flexible metal contact edges for making good electrical contact with the conducting housing of the devices 68 and accommodating surface irregularities to closely join and minimize external leakage or radiation from the cavity 46.

In order to position the device 68 at the opening 66 of the ground plane element 16, a plurality of insulator rods 82 are provided. The rods 82, which may be of nylon each have a connecting end adapted to be inserted through a selected one of the openings 86 (see FIG. 2) in the support member 48. The opposite ends 88 of the rods 82 have a flat end surface adapted for contacting the top surface 76 of the device to be tested 68. The spacing rods 82, thus, serve to position the top conductive surface 76 with respect to the center conductor elements 18, and also place the conductive surface 76 at a elevation which is substantially even with that of the conductive surface provided by the ground plane element 16 for the purpose of minimizing discontinuities in the transmission path of radiant energy along the stripline unit 12. The spacer rods 82 are detachable and may be received in selected openings 86 so that their positions may be adjusted to accommodate for and avoid any protrusions such as handles and knobs 83 which may be present on the surface 76 of the device 68.

Thus, in the use of the testing means 10, the spacer rods 82 are initially positioned to extend from the support member 48 downwardly towards the opening 66, so as to avoid any projections of the apparatus which may extend above its plane conducting surface 76. After the device 68 is placed within the opening 66 with the testing means 10 supported over the device 68 on the spacing rods 82, the panels 60, 62 and 70, 72 which had been extended, are moved toward the sides of the body 68 to reduce the size of the opening 66 and to join and make good electrical contact with the body 68. For the purpose of testing the susceptibility to radiation of the device under test 68, a source of electrical energy such as a power source 90 providing signals of desired frequencies may be coupled by coaxial cable 92 to the couplings 24 at the end section 20 of the stripline unit 12. The signals may be provided with frequencies over a wide band from a very low frequency up to the high frequency cutoff for the transmission of energy in the principal transverse electromagnetic (TEM) mode. If desired a sweep generator may be used to provide the signal with a time varying frequency. For the purpose of minimizing reflections and obtaining uniform transmission of energy and relatively constant electromagnetic fields, the second end 22 of the stripline unit 12 has its coaxial couplings 26 connected to respective terminations 94 providing an impedance which is the characteristic impedance of the stripline unit 12. The energy which is transmitted from the end section 20 to the terminations at the end section 22 sets up magnetic and electric fields in the intermediate section 28 which subject the device 26 under test to "radiated" energy. As will be described, the transmitted fields have a high degree of uniformity and can be determined with a high degree of accuracy. The fields provided by the test means 10 can also be equated to fields produced by radiation of energy through free space and can be generated with power which is much lower than that required by other testing means.

In the case where it is desired to determine leakage radiation emitting from the device 68, the power source 90 is replaced by a signal detecting and measuring apparatus. In this manner, radiation transmitted to the first end 20 by the stripline unit 12 can be measured over a wide band of frequencies. The shielding provided by the enclosed stripline unit 12 avoids interference by external signals thereby, greatly increasing the sensitivity and accuracy of the measured leakage signals from the device 68.

In its operation, the testing means 10, provides the advantages of producing uniform, well defined fields whose intensities are known to a high degree of certainty, as well as no lower frequency cut off. This allows measurements at very low frequencies by using a stripline unit 12 of relatively small configuration and assures operation of the test means 10 at frequencies which have a wavelength greater than the "mean circumference" of the stripline which is defined in connection with FIG. 4.

In order to maximize the band width over which the stripline unit 12 will conduct energy in the principal TEM mode, minimum spacing "b" (see FIG. 4) should be provided between the ground plane elements 14 and 16, and about "b"/2 between the surface 76 of the device 86 to be tested and the center conductors 18. Since the top horizontal surface 76 of the device 68 provides part of the bottom ground plance of the stripline unit 12, sufficient space "b" must be provided to accommodate any objects such as handles and knobs 83 which may protrude above the surface 76. The use of the detachable spacer rods 82 allows their desposition so that they do not interfere with such protrusion, while maintaining the spacing "b" at a desired minimum value, which in most cases can be 3 inches, providing about 1.5 inches between the center conductor elements 18 and surface 76 of device 68.

With the center conductors 18 designed to provide the stripline unit 12 with a characteristic impedance of 50 ohms, allowing it to be connected with generators and detectors of like impedance, the spacing "b" is approximately 3 inches, when the center conductor 18 in the intermediate section 28 is approximately 4 inches wide and has a thickness "t" of approximately 0.02 inches and the relative dielectric constant is 1.0, for the insulating material 56, 58. For a spacing "b" of approximately 4 inches, the cut off wavelength for the TEM transmission of energy is the length of the path 96 shown by dashed lines in FIG. 4. The path 96 is equally spaced about a center conductor element 18 having parallel top and bottom portions spaced respectively between the center conducting element 18 and the top and bottom ground plane elements 14 and 16, and semicircular ends of radius "b"/4. For the spacing "b" of approximately 4 inches for the illustrated configuration, the high cut-off frequency is 889 MHz.

The upper frequency limit can be raised by designing a stripline for a characteristic impedance higher than 50 ohms, which results in a narrower center conductor width, or by designing for the same impedance, but decreasing the spacing "b" of the ground plane elements 14, 16. In this way the band width for the device 10 may be extended from constant or direct current up to 2 GHz, while still providing a useable spacing between the center conductor element 18 and the ground plane element 16. The ability to subject the device 68 under test to a wide range of frequencies by a single testing means 10 is of great importance. This is because testing can take place without requiring the use of a plurality of different testing means, saving set up and testing time and providing continuity and consistency of the results obtained.

Although the stripline unit 12 of the device 10 utilizes three center line elements 18, the stripline unit may also be provided using one or any number of center line element 18. The determination as to the number of stripline center conductor elements 18 to be utilized, depends upon the permissible variation in the electromagnetic field strengths in the transverse direction between the side wall members 40 and 42. Thus, when a single center conductor element 18 is provided, it has been determined that the fields as illustrated in FIG. 5, are maximum on the center line 100 and are down 6 dB at the side locations 102 which are 0.66 of the width "w" on each side of the center line 100. Thus, if the device 68 which is to be tested, has a depth which is greater than 1.32 w, a number of parallel, in-phase center conductor elements 18 may be utilized for maintaining the field variation within desired limits.

When two adjacent center conductor elements 18 are fed in-phase, the fields between the elements 18 add to provide field strengths between the elements 18 which are 6 dB greater than the field strengths provided by a single center conductor element 18. By using a plurality of adjacently spaced, in-phase elements 18, it is possible to space them so that the fields strengths produced between the element 18 are down 6 dB relative to the maximums at their center lines 100. To illuminate the surface 76 of the device 68 within ±3 dB of a nominal field intensity, the adjacent center conductor elements 18 will require a spacing of center lines 100 of 1.6 times the width "w" of a center conductor element 18. The following equation provides the number of center conductor elements 18 required to illuminate a given depth "D" of the device 68 within ±3 dB of a nominal field intensity:

$$n \geq (D/1.6\,w) + 0.175$$

where n equals the number of center conductor elements 18 required, D equals the depth of the device under test, and w equals the width of a center conductor element 18. For the above configuration, the use of four parallel in-phase center conductor elements 18, will allow the uniform illumination of a surface which is 26 inches deep. Since for the operation of the stripline unit 12 with a transmitted signal in the principal transverse electromagnetic (TEM) mode, the line loss is negligible and can be ignored, and this has been done in connection with the above determination of the field strength variations.

The electric field $E_s$ and magnetic field $H_s$ produced within the stripline unit 12 about a center conductor element 18 between the ground planes 14 and 16 of the intermediate section 28 are diagrammatically illustrated by FIG. 5. The magnetic field $H_s$ is represented by a plurality of closed paths extending about the center conductor element 18, while the electric field $E_s$ is represented by the lines extending upwardly from the center conductor element 18 to the top ground plane element 14 and downwardly to the bottom ground plane element 16. Radiation susceptibility, however, is often described in terms of free space radiation, in which the electric field $E_r$ and magnetic field $H_r$ are represented by vectors which are perpendicular to each other and to the direction of propogation. The electric and magnetic field vectors $E_r$ and $H_r$, are thus both parallel to the conductive test surface toward which the radiation is directed. Because of the differences in the free space and TEM field patterns, the difference in the effect of each on the device 68 under test, must be considered.

When free space radiated energy is reflected from the conductive surface 76 of the device 68 under test, the electric field $E_r$ is reversed in phase, while the magnetic field $H_r$ is reflected in-phase. This results in electric field $E_r$ of zero at the surface 76, while the magnetic field $H_r$ is doubled in intensity. However, for the fields in the stripline unit 12, the electric field $E_s$ and the magnetic field $H_s$ are unchanged at the surface 76. This results in an equivalency relationship between the intensities of the magnetic fields $H_r$ and $H_s$, respectively, for application at the surface 76 of the device 68 under test, in which $H_r$ equals 2 $H_s$. Since currents produced by magnetic fields in conductors are directly proportional to the magnetic field intensity H, the surface currents induced by the free space radiated electromagnetic wave are twie as large as those induced by the electromagnetic wave transmitted by the stripline unit 12. Therefore, in order to measure "radiated susceptibility" of the device 68 with respect to the free space radiation $E_o$ in volts/meter, a field strength of 2 $E_o$ volts/meter must be generated within the stripline unit 12. This equivalency was measured for electromagnetic signals between 1000–2000 megahertz for determining whether the system remained well behaved above the theoretical cut-off of the first higher-order TEM mode of 889 MHz. In this band, the average eqivalency ratio was 2.7, indicating that the system has application up to an extended range of 2.0 GHz.

The following table illustrates the results obtained for various frequencies between 500 and 900 MHz where X is equal to the square root of the ratio of the power from a radiating source to the power from the stripline source, with the average power $\overline{X}$ being equal to 2.07:

| FREQUENCY (MHz) | X |
|---|---|
| 500 | 2.3 |
| 600 | 2.1 |
| 700 | 1.7 |
| 800 | 2.0 |
| 900 | 2.2 |

$\overline{X} = 2.07$ $$X = \sqrt{\frac{\text{Power Received with Radiating Source}}{\text{Power Received with Stripline Source}}}$$

One of the important advantages of the invention over the prior testing means and methods used for measuring radiated susceptibility is that the invention provides high field strengths while requiring relatively low input signal power. The power required by the stripline unit 12 with a single center conductor element 18 to produce a field strength E is given by the equation:

$$P = (ES)^2/Z,$$

where E is the field intensity to be generated in volts/meter, S is the spacing in meters between a single center conductor element 18 of the stripline device 12 and a ground plane element 14, 16, and Z is the characteristic impedance of the stripline unit 12 in ohms.

Thus, for example, in order to detect the susceptibility of the device 68 to a free space radiated field of 200 volts/meter, the above equation is solved for a field intensity E of 566 volts/meter. The value of 566 volts/meter for the field intensity E is used, since it provides the required equivalent intensity for the stripline unit 12, of twice that of the radiated field as noted above, and takes into account the requirement that the peak intensity be 3 dB greater than the nominal intensity to be produced. For testing device 10 with more than one center conductor element 18, the power required is determined by the above relationship which is multiplied by the number of center line elements 18. The above relationship also assumes a perfect impedance match with no transmission loss. In practice, the testing means 10 which was produced with three center line elements 18 had a voltage standing wave ration (VSWR) of less than 1.5:1 over a DC to 2 GHz frequency band. This provided a transmission loss of less than 0.2 dB.

Thus, to test the surface 76 of a device 68 if it has a width of 18 inches and a depth of 18 inches, three parallel in-phase lines would be needed, and 28 watts of transmitted energy would be required to measure the "radiated susceptibility" equivant to 200 volts/meter of radiated energy in free space. For comparison, it is noted that an equivalent prior art cell, in which the device to be tested is completely received within the stripline configuration, would require more than 1 kilowatt of input power. Such a cell also has a recommended upper frequency of 100 MHz, although the upper frequency cut-off of this cell using a one wavelength circumference criterion is 65 MHz, compared to a frequency of up to 900 MHz for the testing means 10 operating in the principal TEM mode.

In conclusion, the means and method of the invention overcomes many limitations of the present art for measuring radiated susceptibility and determining leakage radiation from tested devices. The invention provides high field strengths with magnitudes which are known to a high degree of certainty, and generated with relatively low transmitter powers. The invention is relatively small and portable, and allows use of a broad band of testing frequencies. Since the transmitted radiation energy is contained within the testing means 10, radiation hazards are minimized, and susceptibility and leakage measurements can be performed in environments other than controlled screened or underground rooms or tunnels.

It will be obvious to those skilled in the art that additional modifications and variations of the disclosed test means and method will be readily apparent, and that the invention may find wide application with appropriate modifications and meet the particular design circumstances, but without substantial departure from the essence of the invention.

What is claimed is:

1. A testing means for determining susceptibility to radiated energy and leakage of energy from a device having a conductive surface comprising a stripline unit for transmitting radiant energy in the principal transverse electromagnetic mode including a first conductive ground plane element, a second conductive ground plane element spaced from and parallel to the first ground plane element, and a plane center conductor element positioned intermediate and parallel to the first and second ground plane elements, the stripline unit having first and second end sections providing energy coupling means, and an intermediate section between the end sections for transmitting energy therealong, a portion of the first ground plane element of the intermediate section of the stripline unit providing an opening for being closed by a conductive surface of a device which is to be tested and which effectively provides a portion of ground plane of the stripline unit, said opening being adjustable for electrically contacting the device which is to be treated for reducing leakage of energy transmitted by the stripline unit.

2. The testing means of claim 1 in which the first ground plane element includes a movable portion for providing the opening in the stripline unit.

3. The testing means of claim 1 in which the first ground plane element includes a slideable portion which is movable for providing the opening of the stripline unit with an adjustable size and for electrically contacting the device which is to be tested for reducing leakage of energy transmitted by the stripline unit.

4. The testing means of claim 1 in which the first ground plane element includes a pair of oppositely positioned slideable portions which are movable for providing the opening of the stripline unit with an adjustable size and for electrically contacting and joining the device which is to be tested for reducing leakage of energy transmitted by the stripline unit.

5. The testing means of claim 1 in which the first ground plane element includes first and second pairs of oppositely positioned portions slideably supported in respective tracks and each movable to provide an adjustable rectangular opening in the first ground plane element, the opening of the first ground plane element being provided with a ground plane surface by receiving therein the conducting surface of the device which is to be tested, and the slideable portions of the first ground plane element having edges for electrically engaging and joining the device and reducing leakage of energy transmitted by the stripline unit.

6. The testing means of claim 1 in which the stripline unit includes means for spacing the conductive surface of the device which is to be tested with respect to the center conductor element.

7. A testing means for determining susceptibility to radiated energy and leakage of energy from a device having a conductive surface comprising a stripline unit for transmitting radiant energy in the principal transverse electromagnetic mode including a first conductive ground plane element, a second conductive ground plane element spaced from and parallel to the first ground plane element, and a plane center conductor element positioned intermediate and parallel to the first and second ground plane elements, the stripline unit having first and second end sections providing energy coupling means, and an intermediate section between the end sections for transmitting energy therealong, a portion of the first ground plane element of the intermediate section of the stripline unit providing an opening for being closed by a conductive surface of a device which is to be tested and which effectively provides a portion of ground plane of the stripline unit, the stripline unit including means for spacing the conductive surface of the device which is to be tested with respect to the center conductor element, the spacing means comprising insulating means extending from a location proximate to the center conductor element to the plane of the first ground plane element.

8. The testing means of claim 7 in which the insulating means comprises a plurality of insulator rods each having a first end which is detachably securable with the stripline unit at a location proximate to the plane of the center conductor element and a second end adapted for engaging the device to be tested and positioning its conductive surface with respect to the center conductor element.

9. The testing means of claim 8 in which the intermediate portion of the stripline unit includes a plane member of insulating material positioned between and parallel to the first and second ground plane elements and proximate to the plane of the center conductor element, the plane member having means for detachably securing therewith the first ends of the insulator rods.

10. The testing means of claim 9 in which the means of the plane member for detachably securing therewith the insulator rods includes a plurality of spaced openings, the first ends of said rods are adapted for being received through respective openings of the plane member and being detachably secured therewith, and the second ends each have a flat bearing surface for engaging the conductive surface of the device which is to be tested.

11. The testing means of claim 1 in which the end sections of the stripline unit are tapered to provide ends of reduced size, the spacing between the ground plane elements at the ends of the end sections is reduced from the spacing provided at the intermediate section, and the center conductor element has ends which taper to a reduced width from its width at the intermediate section of the stripline.

12. The testing means of claim 11 in which the end of each end section of the stripline unit has a coaxial connector with an outer conductor connected with a ground plane element and a center conductor connected with a respective end of the center conductor element of the stripline unit.

13. The testing means of claim 1 in which the stripline unit includes a plurality of coplanar center conductor elements spaced from each other and positioned intermediate and parallel to the first and second ground plane elements.

14. The testing means of claim 13 in which the end sections of the stripline unit are tapered to provide ends of reduced size, the spacing between the ground plane elements at the ends of the end sections is reduced from the spacing provided at the intermediate section, and the center conductor elements each have ends which taper to a reduced width from its width at the intermediate section of the stripline.

15. The testing means of claim 14 in which the end of each end section of the stripline unit has a coaxial connector for each center conductor element with an outer conductor connected with a ground plane element and a center conductor connected with an end of a respective one of the center conductor elements of the stripline unit.

16. The testing means of claim 1, 11, or 13 which includes a source providing electrical energy to the coupling means of the first end section of the stripline unit for transmission in the principal transverse electromagnetic mode to its second end section, and terminating means connected with the coupling means of the second end section of the stripline unit.

17. The testing means of claim 1, 11, or 13, which includes a source providing electrical energy over a wide frequency band to the coupling means of the first end section of the stripline unit for transmission in the principal transverse electromagnetic mode to its second end section, and terminating means having an impedance which is the characteristic impedance of the stripline unit connected with the coupling means of the second end section of the stripline unit.

18. The testing means of claim 1, 11, or 13, which includes energy measuring means connected with the coupling means of the first end section of the stripline, and terminating means connected with the coupling means of the second end section of the stripline unit.

19. The testing means of claim 1, 11, or 13, which includes energy measuring means which detects energy over a wide frequency band connected with the coupling means of the first end section of the stripline unit, and terminating means having an impedance which is the characteristic impedance of the stripline unit connected with the coupling means of the second end section of the stripline unit.

20. A method of testing for determining susceptibility of a device having a conductive surface to radiated energy and leakage of energy therefrom comprising the steps of providing a stripline unit for transmitting radiant energy in the principal transverse electromagnetic mode which has first and second conductive ground plane elements and a center conductor element intermediate the ground plane elements, and an adjustable opening in a ground plane element, positioning a device which is to be tested, with respect to the stripline unit so that a conductive surface of the device encloses the opening of the ground plane of the stripline unit and effectively provides a portion of the ground plane of the stripline unit, adjusting the opening in the ground plane element for accommodating the conductive surface of the device which is to be tested, electrically connecting the conductive surface of the device to be tested with the ground plane element which has the opening, for reducing leakage of energy transmitted by the stripline unit, and applying electrical energy for transmission by the stripline unit.

21. The method of claim 20 which includes the step of securing detachable insulating means to the stripline unit at selected locations prior to positioning the device for engaging the device and spacing its conductive surface with respect to the center conductor element of the stripline unit.

22. The method of claim 21 in which the energy applied to the stripline unit for transmission is from an external source and the device being tested is subjected to the energy transmitted by the stripline unit.

23. The method of claim 21 in which the energy applied to and transmitted by the stripline unit is from the device being tested and includes the step of detecting and measuring the energy transmitted by the stripline unit from the device under test.

* * * * *